United States Patent [19]

Katz

[11] Patent Number: 5,073,607
[45] Date of Patent: Dec. 17, 1991

[54] POLYIMIDE COMPOSITIONS CONTAINING POLYORGANOSILOXANE FOR IMPROVING ATOMIC OXYGEN RESISTANCE

[75] Inventor: Morton Katz, Columbus, Ohio

[73] Assignee: E. I. du Pont de Nemours and Company, Wilmington, Del.

[21] Appl. No.: 407,607

[22] Filed: Sep. 15, 1989

[51] Int. Cl.$^5$ .............................................. C08L 77/00
[52] U.S. Cl. ................... 525/431; 525/474; 528/26
[58] Field of Search ................. 525/431, 474; 528/26

[56] References Cited

U.S. PATENT DOCUMENTS

| 3,355,399 | 11/1967 | Cekada | 525/431 |
| 4,558,110 | 12/1985 | Lee | 528/26 |
| 4,606,530 | 8/1986 | Litchinko et al. | 266/158 |

FOREIGN PATENT DOCUMENTS 0284803 10/1988 European Pat. Off. ............... 77/42

OTHER PUBLICATIONS

18th International SAMPE Technical Conference, Oct. 7–9, 1986, (Preprint).
32nd International SAMPE Symposium, Apr. 6–9, 1987 (Preprint).

*Primary Examiner*—Melvyn I. Marquis
*Assistant Examiner*—Margaret W. Glass

[57] ABSTRACT

A polyimide composition is disclosed with improved atomic oxygen resistance through incorporation of a specific polyorganosiloxane.

16 Claims, No Drawings

POLYIMIDE COMPOSITIONS CONTAINING POLYORGANOSILOXANE FOR IMPROVING ATOMIC OXYGEN RESISTANCE

BACKGROUND OF THE INVENTION

This invention relates to a polyimide composition, preferably in the form of a film or sheet, containing a polyorganosiloxane for improving atomic oxygen resistance (AOR).

Data from space shuttle flights has revealed that many surface protective materials commonly used on satellite systems such as polyesters, polyimides, and polyurethanes, undergo drastic degradation by the atomic oxygen environment of the low earth orbit (LEO). The atmosphere interacts with the space craft surface materials, causing changes in their surface and bulk properties. The degradation manifests itself as material mass loss and changes in surface morphology, strength and thermal/optical properties. For example, polyimide film when exposed to atomic oxygen on shuttle flights turned from glossy amber to a flat yellow, and measurably lost thickness.

A preprint of the 32nd International SAMPE Symposium, April 6–9, 1987, discloses on page 590 imidized polyimide-polydimethylsiloxane segmented copolymers derived from 3,3',4,4'-benzophenone tetracarboxylic dianhydride, 4,4'-diaminodiphenyl ether and from 30 to 50% of polydimethylsiloxane oligomer segments. The polysiloxane-modified polyimide copolymers show improved weatherability to aggressive oxygen environments and are used as protective coatings for aerospace applications. In contrast, the polyimide compositions of the invention do not contain polysiloxane copolymer segments.

A preprint of the 18th International SAMPE Technical Conference, October 7–9, 1986, discloses on page 1018 (Table 1) a 25% polysiloxane/45% polyimide composition which exhibits low reaction efficiency when exposed to atomic oxygen in LEO. The composition of neither the polyimide nor the polysiloxane is disclosed, however.

European Patent Application 0 284 803 published October 5, 1988, discloses fully imidized polyimidosiloxanes derived from oxydiphthalic anhydride, a difunctional siloxane monomer and an organic diamine for use in wire and cable coating and for preparing film, fibers and molded and extruded articles. The compositions are not disclosed as having improved atomic oxygen resistance.

U.S. application Ser. No. 606,430, filed May 2, 1984, now abandoned to NASA discloses a flexible laminate comprising a polyimide layer coated with a silicone composition for use as an atomic oxygen degradation resistant support for a solar cell array in outer space.

SUMMARY OF THE INVENTION

In accordance with the present invention, polyimide compositions comprise a polyimide derived from an aromatic dianhydride and a diamine and an atomic oxygen resisting amount of a polyorganosiloxane of the formula:

wherein $R_1$ is lower alkyl having 1 ∝ 10 carbons, substituted alkyl, aryl, substituted aryl, vinyl, allyl or hydrogen; $R_2$ is lower alkyl having 1–10 carbons, or aryl; and where one of m or n is 0 and the other of m or n is 2–1000 or where m or n is not 0 and m and n are both 2–1000. Typically, the silicon atoms have one or more side groups attached, generally phenyl, ethyl or methyl groups.

It has now been found that polyimide compositions, preferably in the form of films or sheets, having superior atomic oxygen resistance can be obtained by inclusion of from 30 to 60 weight %, preferably 40 to 50 weight %, of a specified polyorganosiloxane component in the composition. The invention provides polyimide compositions having almost two orders of magnitude greater atomic oxygen resistance compared to polyimides not containing the polyorganosiloxane.

The polyimide compositions of the invention are particularly useful for the fabrication of flexible photovoltaic array blankets for use in space stations. The array must survive an environment which includes atomic oxygen for a period of 15 years. Although polyimide film (such as sold under the trademark Kapton ® polyimide by E. I. du Pont de Nemours & Co.) is the material of choice for this application, if it were unprotected from the atomic oxygen, the polyimide would disappear over that time period. Thus, a polyimide film with good physical, electrical, thermal resistance, and resistance to atomic oxygen, has great utility as a flexible circuit substrate for solar array blankets.

DETAILED DESCRIPTION OF THE INVENTION

The polyimides used in this invention can be made generally as disclosed in U.S. Pat. Nos. 3,179,630 and 3,179,634, the disclosures of which are hereby incorporated by reference. Polyamic acids are made by dissolving substantially equimolar amounts of at least one aromatic dianhydride and at least one diamine in a solvent and agitating the resulting solution under controlled temperature conditions until polymerization of the dianhydride and the diamine is completed.

Suitable dianhydrides for use in the polyimides include: pyromellitic dianhydride; 2,3,6,7-naphthalene tetracarboxylic dianhydride; 3,3',4,4'-biphenyl tetracarboxylic dianhydride; 1,2,5,6-naphthalene tetracarboxylic dianhydride; 2,2',3,3'-biphenyl tetracarboxylic dianhydride; 3,3'4,4'-benzophenone tetracarboxylic dianhydride; 2,2-bis(3,4-dicarboxyphenyl) propane dianhydride; bis(3,4,9,10-dicarboxyphenyl) sulfone dianhydride; 3,4,9,10-perylene tetracarboxylic dianhydride; bis(3,4-dicarboxyphenyl) propane dianhydride; 1,1-bis(2,3-dicarboxyphenyl) ethane dianhydride; 1,1-bis(3,4-dicarboxyphenyl) ethane dianhydride; bis(2,3-dicarboxyphenyl) methane dianhydride; bis(3,4-dicarboxyphenyl) methane dianhydride; oxydiphthalic dianhydride; bis(3,4dicarboxyphenyl) sulfone dianhydride; and the like.

Suitable diamines for use in the polyimides include: 4,4'-diaminodiphenyl propane; 4,4'-diamino diphenyl methane; benzidine; 3,3'-dichlorobenzidine; 4,4'-diamino diphenyl sulfide; 3,3'-diamino diphenyl sulfone; 4,4'-diamino diphenyl sulfone; 4,4'-diamino diphenyl ether; 1,5-diamino naphthalene; 4,4'-diamino diphenyl diethylsilane; 4,4'-diamino diphenylsilane; 4,4'-diamino diphenyl ethyl phosphine oxide; 4,4'-diamino diphenyl N-methyl amine; 4,4'-diamino diphenyl N-phenyl amine; 1,4-diaminobenzene (p-phenylene diamine); 1,3-diaminobenzene; 1,2-diaminobenzene; and the like.

The preferred polyimide used in this invention is derived from 4,4'-diaminodiphenyl ether and pyromellitic dianhydride.

Copolyimides derived from any of the above diamines and dianhydrides are also operable. Particularly preferred copolyimides are those derived from 15 to 85 mole % of biphenyltetracarboxylic dianhydride, 15 to 85 mole % pyromellitic dianhydride, 30 to 100 mole % p-diaminodiphenyl and 0 to 70 mole % of 4,4'-diaminodiphenyl ether. Such copolyimides are described in U.S. Pat. No. 4,778,872 which disclosure is also incorporated herein by reference.

The solvent must dissolve one or both of the polymerizing reactants and, preferably, will dissolve the polyamic acid polymerization product. The solvent must, of course, be substantially unreactive with all of the polymerizing reactants and with the polyamic acid polymerization product.

Preferred solvents include normally liquid N,N-dialkylcarboxylamides, generally. Preferred ones of those solvents include the lower molecular weight members of such carboxylamides, particularly N,N-dimethylformamide and N,N-diethylacetamide. Other useful compounds of this class of solvents are N,N-diethylformamide and N,N-diethylacetamide. Other solvents which may be used are dimethylsulfoxide, N-methyl-2-pyrrolidone, tetramethyl urea, dimethylsulfone, hexamethylphosphoramide, tetramethylene sulfone, and the like. The solvents can be used alone, in combinations with one another or in combinations with poor solvents such as benzene, benzonitrile, dioxane, etc. The amount of solvent used preferably ranges from 75 to 90 weight % of the polyamic acid, since this concentration has been found to give optimum molecular weight.

The polyamic acid solutions are generally made by dissolving the diamine in a dry solvent and slowly adding the dianhydride under conditions of agitation and controlled temperature in an inert atmosphere. The diamine is conveniently present as a 5 to 15 weight percent solution in the solvent and the diamine and dianhydride are usually used in about equimolar amounts.

Conversion of the polyamic acid to polyimide can be accomplished by either a thermal conversion or a chemical conversion process. According to the thermal conversion process, the polyamic acid solution is cast on a heated conversion surface, such as a metal drum or belt, and heated at a temperature of above about 50° C. to partially convert the polyamic acid to polyimide. The extent of polyamic acid conversion depends on the temperature employed and the time of exposure, but, generally about 25 to 95% of amic acid groups are converted to imide groups. The partially converted polyamic acid is then heated at or above 220° C to obtain complete conversion to the polyimide.

In the chemical conversion process, the polyamic acid solution is first chilled to about 10° C. to −10° C. and polyamic acid conversion chemicals are added. The polyamic acid conversion chemicals are tertiary amine catalysts and anhydride dehydrating materials. The preferred anhydride dehydrating material is acetic anhydride and is used in slight molar excess of the amount of amic acid groups in the polyamic acid, typically about 2–2.5 moles per equivalent of polyamic acid. A comparable amount of tertiary amine catalyst is used. Besides acetic anhydride, other operable lower fatty acid anhydrides include propionic, butyric, valeric, mixed anhydrides of these with one another and with anhydrides of aromatic monocarboxylic acids, for example, benzoic acid, naphthoic acid, and the like, and with anhydrides of carbonic and formic acids, as well as aliphatic ketenes (ketene and dimethyl ketene). Ketenes may be regarded as anhydrides of carboxylic acids derived from drastic dehydration of the acids.

The preferred tertiary amine catalysts are pyridine and beta-picoline and they are used in an amount of about one mole per mole of anhydride dehydrating material. Tertiary amines having approximately the same activity as the preferred pyridine and beta-picoline may also be used. These include 3,4-lutidine; 3,5-lutidine; 4-methyl pyridine; 4-isopropyl pyridine; N-dimethyl benzyl amine; isoquinoline; 4-benzyl pyridine, and N-dimethyl dodecyl amine. Trimethyl amine and triethyl amine are more active than those amines listed above and can be used in smaller amounts.

The polyamic acid conversion chemicals react at about room temperature or above to convert polyamic acid to polyimide. The chemical conversion reaction occurs at temperatures from 10 to 120° C, with the reaction being very rapid at the higher temperatures and very slow at the lower temperatures. Below a certain temperature, polyamic acid chemical conversion comes to a practical halt. This temperature is generally about 10° C. It is important, therefore, that the polyamic acid solution be chilled below this temperature before adding the polyamic acid conversion chemicals and that the temperature of the solution, with conversion chemicals, be maintained below this temperature during extrusion or casting.

The treated, chilled, polyamic acid solution is cast or extruded onto a heated conversion surface whereupon some of the solvent is evaporated from the solution, the polyamic acid is partially chemically converted to polyimide, and the solution takes the form of a polyamic acid-polyimide gel. Conversion of amic acid groups to imide groups depends on contact time and temperature but is usually about 25 to 95% complete. As a film or fiber or similar shaped structure of indefinite length, the gel is self-supporting in spite of its high solvent content.

The gel is subsequently dried to remove the water, residual solvent, and remaining conversion chemicals, and the polyamic acid is completely converted to polyimide. The drying can be conducted at relatively mild conditions without complete conversion of polyamic acid to polyimide at that time, or the drying and conversion can be conducted at the same time using higher temperatures. Because the gel has so much liquid which must be removed during the drying and converting steps, the gel must be restrained during drying to avoid undesired shrinkage. In continuous production, the film can be held at the edges, such as in a tenter frame using tenter clips or pins for restraint. A polyimide film which is permitted to shrink excessively during drying and conversion is brittle and lacks the superior performance characteristics expected of polyimide film materials.

Preferably, high temperatures are used for short times to dry the film and convert it to polyimide in the same step. It is preferred to heat the film to a temperature of 200–450° C. for 15 to 400 seconds. Of course, less heat and time are required for thin films than for thicker films. During this drying and converting, the film is restrained from undue shrinking and, in fact, can be stretched by as much as 40 percent of its initial dimension prior to completion of the drying and conversion. Stretching can be in any dimension. In film manufacture, stretching can be in either the longitudinal direction or the transverse direction. If desired the restraint can also be provided to permit some limited degree of shrinkage, shrinkage of as much as 15 percent has been found to provide an adequate product.

The polyimide compositions of this invention include a polyorganosiloxane in sufficient amount to impart atomic oxygen resistance to the composition. The polyorganosiloxanes employed herein are specific to silicone polymers which are partly organic and partly inorganic. They have alternating silicon and oxygen atom linkages which are believed to contribute to the outstanding properties when combined with polyimides. The polyorganosiloxanes are of the formula:

[R$_1$R$_2$SiO[ R$_1$SiO$_{3/2}$[$_n$ wherein R$_1$ is lower alkyl having 1–10 carbons, substituted alkyl, aryl, substituted aryl, vinyl, allyl or hydrogen; R$_2$ is lower alkyl having 1–10 carbons, or aryl; and where one of m or n is 0 and the other of m or n is 2–1000 or where m or n is not 0 and m and n are both 2–1000. Typically, the silicon atoms have one or more side groups attached, generally phenyl, ethyl or methyl groups.

The polyorganosiloxanes operable herein have viscosities in excess of 50 centipoises, preferably in excess of 5000 centipoises. They can be gum-like in appearance such as with viscosities in a range from 10,000 to 25,000 poises. Additional useful polyorganosiloxanes are available as low melting point solids. The molecular weights of the polyorganosiloxanes are preferably above 200 such as in a range from 200 to 23,000 with a preferred range being from 500 to 16,000.

Specific polymers include the following materials, which are not meant to be totally inclusive: polymethyl-, -dimethyl-, -phenyl-, -diphenyl-, -methylphenyl-, -vinyl-, -methylvinyl-, -allyl-, -aminopropyl-, -methylaminopropyl-, -aminophenyl-, -fluoroalkylphenyl-, -acryloxypropyl-, -cyanopropyl-, -chloropropyl-, -3,3,3-trifluoropropyl-, -methyl-3,3,3-trifluoropropyl- siloxanes.

In the preferred polyorganosiloxanes, R! and R2 are phenylsiloxy and fluorophenylsiloxy and afford good heat resistance in the finished product as well as having good compatibility during processing. These groups can be present in a range of about 3 to about 60 mole percent and are present preferably at about 10 to about 50 mole percent.

A particularly preferred polyorganosiloxane has the formula

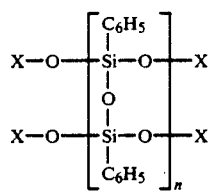

where each X independent of the other is H, CH$_3$ or C$_2$H$_5$ and n=2 to 1000.

The amount of polyorganosiloxane included in the polyimide composition must be sufficient to improve the atomic oxygen resistance of the composition. Typically, such amounts range from 30 to 60% by weight of the total polyimide composition, and, preferably, range from 40–50 weight percent. If less than 30 percent is used, the improvement in atomic oxygen resistance is generally is not substantial. If more than 60 weight percent is used, the mechanical and physical properties of the polyimide composition are generally adversely affected.

The polyorganosiloxane can be added to the polyimide during the production process or can be blended with the polyimide by melt or solution blending. The polyorganosiloxane can be dissolved in a polar solvent such as dimethylformamide, dimethyacetamide, dimethylsulfoxide, or N-methylpyrrolidone or in some cases poor solvents. The solution can be admixed with the polyamic acid solution and the polyamic acid subsequently converted to polyimide. Other polyorganosiloxanes not miscible in polar solvents can be dissolved in non-polar solvents such as benzene, toluene or dioxane, and then admixed with the polyamic acid solution in the polar solvent.

In accordance with this invention, polyimide compositions containing a polyorganosiloxane have superior atomic oxygen resistance when exposed to the atmospheric conditions of the low earth orbit (LEO). Surprisingly, the mechanical and physical properties of the polyimides are not significantly adversely affected by incorporation of the polyorganosiloxane.

The rate of material loss due to atomic oxygen is a function of the number of oxygen atoms striking a unit of area during a given time period. This number, called fluence, is proportional to atmospheric density, orbital velocity, surface orientation relative to the vector velocity, and the period of exposure. An oxygen plasma reactor operating at low pressure (3 -10$^{-2}$ torr) was used to reproduce degradation morphology and material mass loss similar to that obtained in LEO.

Material erosion rates (g/cm$^2$-sec) were determined by a careful analysis of the loss of weight of the polyimide composition after predetermined exposure times and was dependent on the flux. The flux was measured using a Kapton ® dosimeter in which flux measurements in space shuttle flights using Kapton ® were correlated to mass losses in Kapton ® subjected to atomic oxygen bombardment in the laboratory. Erosion rates were calculated from the flux and fluence. The fluence itself was determined by the flux and the length of time the material was under bombardment.

In the following examples the tensile strength, elongation, and modulus were tested according to ASTM D-882-64T. The MIT folding endurance was determined by ASTM D-2176-63T and the Elmendorf tear test was ASTM D-1922-61T. All percentages are by weight unless otherwise specified.

EXAMPLE 1

This example describes the preparation of an AOR Kapton ® polyimide film containing 45 weight % polyphenylsiloxane.

Polyphenylsiloxane (8165 g), purchased from Owens-Illinois Chemical Co., and designated as T-950-S, was dissolved in 2858 g of dimethyl acetamide heated to 80° C. The solution was added to 110 lbs. of a 20.3% polyamide acid solution containing equimolar amounts of pyromellitic dianhydride and 4,4'-diaminodiphenyl ether in dimethyl acetamide in a commercial Hobart mixer. Stirring was continued for one hour, 4 lbs. of a 20% solution of triphenylphosphite was added and stirring continued for an additional 45 minutes. A total of about 15 gals. of polyphenylsiloxane polyamide-acid polymer dope was obtained having a Brookfield viscosity of 2540 poises.

The dope was extruded through a slit die onto a stainless steel belt and heated to 150° C to partially convert the polyamide acid to polyimide. The partially converted film was placed in a pin tenter frame and heated at 400° C. in an oven until substantially all of the dimethyl acetamide was removed.

Tables I and II summarize the atomic oxygen resistance of the polyimide film and Table III describes the physical properties of the polyimide film and provide comparisons with polyimide film not containing the polyorganosiloxane (Comp. Example 1) and prior art polyimide films which are either coated with silica (Comp. Example 2) or contain copolymerized polysiloxane segments (Comp. Example 3)

TABLE I

EFFECT OF ATOMIC OXYGEN BEAM*
EXPOSURE ON POLYIMIDE FILM

| Material | | Fluence atoms/cm$^2$ | Erosion Rate g/cm$^2$-sec |
|---|---|---|---|
| Ex. 1 | Polyimide film + 45% [polyphenylsiloxane] | $1.2 \times 10^{21}$ $1.2 \times 10^{21}$ | $2.1 \times 10^{-9}$ $2.1 \times 10^{-9}$ |
| Comp. Ex.1 | Polyimide film (No polyorganosiloxane) | $1.7 \times 10^{20}$ | $1.9 \times 10^{-7}$ |
| Comp. Ex. 2 | Polyimide film coated with SiO$_2$ | $1.7 \times 10^{20}$ | $7.6 \times 10^{-9}$ |

*Neutral atomic oxygen.

TABLE II

EFFECT OF ATOMIC OXYGEN PLASMA*
EXPOSURE ON POLYIMIDE FILM

| Material | | Fluence atoms/cm$^2$ | Erosion Rate g/cm$^2$-sec |
|---|---|---|---|
| Ex. 1 | Polyimide film + 45% [polyphenylsiloxane] | $1.7 \times 10^{21}$ | $5.4 \times 10^{-9}$ |
| Ex. 2 | Polyimide film + 50% [polyphenylsiloxane] | $6.26 \times 10^{20}$ | $3.33 \times 10^{-8}$ |
| Ex. 3 | Polyimide film + 55% [polyphenylsiloxane] | $6.26 \times 10^{20}$ | $9.51 \times 10^{-9}$ |
| Comp. Ex. 1 | Polyimide film [No polyphenylsiloxane] | $3 \times 10^{20}$ | $2.0 \times 10^{-7}$ |
| Comp. Ex. 2 | Polyimide film [Coated with SiO2] | $2 \times 10^{21}$ | $4.7 \times 10^{-10}$ |
| Comp. Ex. 3 | Polyimide-polysiloxane Copolymer | $1.7 \times 10^{21}$ | $3.6 \times 10^{-10}$ |

*Neutral and charged atomic oxygen.

TABLE III

PHYSICAL PROPERTIES OF AOR FILMS

| | Comp. Ex. 1 (MD/TD) | Ex. 1 (MD/TD) |
|---|---|---|
| Tensile Strength (KPSI) | 24/22 | 13/11 |
| Elongation (%) | 80/104 | 39/27 |
| Modulus (KPSI) | 391/355 | 317/285 |
| MIT Fold (K cycles) | 77/60 | 50/39 |
| Elmendorf Tear (g/mil) | 13.9/14.6 | 4.8/5.1 |
| Graves Tear (lbs/mil) | 1.8/2.1 | 2.1/2.2 |

MD means machine direction
TD means transverse direction

Based on the results given in Tables I and II, it can be seen that the polyimide composition of this invention (Ex. 1) has an erosion rate two orders of magnitude less than polyimide not containing the polyorganosiloxane (Comp. Ex. 1) making it an excellent candidate for use on spacecraft surfaces operating in the LEO. Moreover, this polyimide composition retains much of the inherent toughness, flexibility and mechanical strength of the polyimide without the polyorganosiloxane (Table III).

EXAMPLES 2 AND 3

These two examples describe the preparation of AOR polyimide films containing 50 and 55 weight %, respectively, of polyphenylsiloxane.

Examples 2 and 3 were prepared essentially as described in Example 1.

A 35% solution of polyphenylsiloxane T-950F (flake) in dimethyl acetamide was prepared. A casting dope was prepared from 42.9 g of this solution and 75 g of a 20.3% polyamide acid solution of equimolar amounts of pyromellitic dianhydride and 4,4'-diaminodiphenyl ether in dimethylacetamide.

A second casting of dope was prepared from 52.4 g of the polyphenylsiloxane solution and 75 g of the polyamide acid solution.

The two dopes were cast and thermally converted to polyimide films containing 50 and 55% by weight of polyphenylsiloxane, respectively, as described in Example 1. The atomic oxygen resistance of Examples 2 and 3 are reported in Table II.

What is claimed is:

1. A polyimide composition having improved oxygen resistance comprising
   (i) a polyimide formed by reaction of a substantially equimolar amount of (a) at least one aromatic dianhydride and (b) at least one diamine and
   (ii) a polyorganosiloxane of the formula

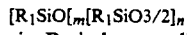

wherein R$_1$ is lower alkyl having 1-10 carbons, substituted alkyl, aryl, substituted aryl, vinyl or hydrogen; R$_2$ is lower alkyl having 1-10 carbons, or aryl; and where one of m or n is 0 and the other of m or n is 2-1000 or where m or n is not 0 and m and n are both 2-1000.

2. The polyimide composition of claim 1 wherein the polyorganosiloxane is of the formula

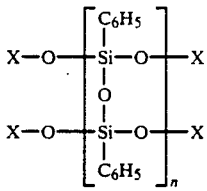

where each X independent of the other is H, CH$_3$ or C$_2$H$_5$ and n=2 to 1000.

3. The polyimide composition of claim 1 wherein the polyorganosiloxane comprises from 30 to 60% by weight of the composition.

4. The polyimide composition of claim 3 wherein the polyorganosiloxane comprises from 40 to 50% by weight of the composition.

5. The polyimide composition of claim 1 wherein the polyorganosiloxane has a viscosity ranging from 10,000 to 25,000 poises.

6. The polyimide composition of claim 1 wherein the polyorganosiloxane has a molecular weight ranging from 200 to 23,000.

7. The polyimide composition of claim 6 wherein the polyorganosiloxane has a molecular weight ranging from 500 to 16,000.

8. The polyimide composition of claim 1 wherein the aromatic dianhydride is pyromellitic dianhydride and the diamine is 4,4'-diaminodiphenyl ether.

9. The polyimide composition of claim 8 wherein the polyorganosiloxane is polyphenylsiloxane.

10. The polyimide composition of claim 9 wherein polyphenylsiloxane comprises from 40 to 60% by weight of the composition.

11. The polyimide composition of claim 1 wherein the aromatic dianhydride is 3,3′,4,4′-biphenyltetracarboxylic dianhydride and the diamine is 4,4′-diaminediphenyl ether.

12. The polyimide composition of claim 11 wherein the polyorganosiloxane comprises from 40 to 60% by weight of the composition.

13. The polyimide composition of claim 1 wherein the aromatic dianhydride is oxydiphthalic dianhydride and the diamine is 4,4′-diaminodiphenyl ether.

14. The polyimide composition of claim 13 wherein the polyorganosiloxane comprises from 40 to 60% by weight of the composition.

15. The polyimide composition of claim 1 wherein the aromatic dianhydride comprises from 15 to 85 mole % of 3,3′,4,4′-biphenyltetracarboxylic dianhydride and 85 to 15 mole % of pyromellitic dianhydride and the diamine comprises from 30 to 100 mole % p-phenylenediamine and 0 to 70 mole % of 4,4′-diaminodiphenyl ether.

16. The polyimide composition of claim 15 wherein the polyorganosiloxane comprises from 40 to 60% by weight of the composition.

* * * * *